United States Patent
Otobe (10) Patent No.: US 8,587,363 B2
(45) Date of Patent: Nov. 19, 2013

(54) HIGH FREQUENCY SWITCHING CIRCUIT REDUCING POWER CONSUMPTION AND METHOD OF CONTROLLING THE SAME

(75) Inventor: Eiichiro Otobe, Yokohama (JP)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 13/355,306

(22) Filed: Jan. 20, 2012

(65) Prior Publication Data
US 2013/0187698 A1 Jul. 25, 2013

(51) Int. Cl.
*H03K 17/687* (2006.01)
(52) U.S. Cl.
USPC ............................ 327/427; 327/434; 333/103
(58) Field of Classification Search
USPC ............................ 327/424, 434, 427; 333/103
See application file for complete search history.

(56) References Cited

U.S. PATENT DOCUMENTS

| 7,652,924 B2 * | 1/2010 | Kawajiri et al. .......... 365/185.18 |
| 7,782,120 B2 * | 8/2010 | Kim et al. .................... 327/535 |
| 7,847,618 B2 * | 12/2010 | Gebara et al. ................ 327/536 |

FOREIGN PATENT DOCUMENTS

JP   2008-035560   2/2008

* cited by examiner

*Primary Examiner* — Kenneth B. Wells
(74) *Attorney, Agent, or Firm* — McDermott Will & Emery LLP (57) ABSTRACT

There is provided a high frequency switching circuit reducing power consumption at the time of signal reception and signal transmission. The high frequency switching circuit includes a pulse generation unit generating a clock selecting pulse signal having a predetermined active period; a clock selection unit selecting a reference clock signal when the clock selecting pulse signal is in an active state and selecting a low-speed clock signal having a frequency lower than that of the reference clock signal when the clock selecting pulse signal is not in an active state; a voltage down unit accumulating negative charges in a capacitor to generate predetermined negative voltage; and a switching unit including at least one switch holding a turned-off state by being applied with the predetermined negative voltage.

7 Claims, 6 Drawing Sheets

HIGH FREQUENCY SWITCHING CIRCUIT REDUCING POWER CONSUMPTION AND METHOD OF CONTROLLING THE SAME

BACKGROUND OF THE INVENTION

1. Field of the Invention

The present invention relates to a high frequency switching circuit and a method of controlling the same.

2. Description of the Related Art

Recently, the reduction of power consumption in miniaturized wireless communication devices such as mobile phones and the like has become important. Since wireless communications devices transmit or receive information by switching switches at a high speed, a considerable amount of power is consumed in the switches and a driving circuit therefor.

Generally, mobile phones include a transmitting mode, a receiving mode, a transmitting and receiving mode as a communication mode, and a field effect transistor as the switches switch a transmitting/receiving circuit connected to an antenna at high speed, every time the communication mode is changed.

In addition, the field effect transistor is connected to a voltage up circuit or a voltage down circuit (negative voltage generation circuit) as the driving circuit. The voltage up circuit mainly improves transmit power supplied to the antenna from a transmit circuit. Meanwhile, the voltage down circuit mainly improves output characteristics in a state in which the field effect transistor is turned-off.

As a technology for reducing power consumption in the voltage up circuit, technology disclosed in Patent Document (Patent Document: Japanese Patent Laid-Open Publication No. 2008-35560) has been applied. In the high frequency switching circuit described in the Patent Document, a voltage up circuit is operated at the time of a transmission requiring a large amount of power but is not operated at the time of signal reception not requiring a large amount of power, thereby reducing power consumption.

However, the high frequency switching circuit of the above-mentioned Patent Document may be applied to reduce power consumption at the time of signal reception but not reduce power consumption at the time of signal transmission. Therefore, a communication system such as the Universal Mobile Telecommunications System (UMTS), in which, for example, the voltage up circuit or the voltage down circuit needs to be operated at all times, may not use the high frequency switching circuit described in the above-mentioned Patent Document.

SUMMARY OF THE INVENTION

An aspect of the present invention provides a high frequency switching circuit reducing power consumption at the time of signal reception and signal transmission.

Further, another aspect of the present invention provides a method of controlling a high frequency switching circuit reducing power consumption at the time of signal reception and signal transmission.

According to an aspect of the present invention, there is provided a high frequency switching circuit including: a pulse generation unit generating a clock selecting pulse signal having a predetermined active period; a clock selection unit selecting a reference clock signal when the clock selecting pulse signal is in an active state and selecting a low-speed clock signal having a frequency lower than that of the reference clock signal when the clock selecting pulse signal is not in an active state; a voltage down unit accumulating negative charges in a capacitor at a speed according to the frequency of the clock signal selected in the clock selection unit to generate predetermined negative voltage; and a switching unit including at least one switch holding a turned-off state by being applied with the predetermined negative voltage.

According to another aspect of the present invention, there is provided a method of controlling a high frequency switching circuit, including: activating a clock selecting pulse signal; supplying a reference clock signal to a voltage down unit for an active period of the clock selecting pulse signal and applying predetermined negative voltage generated by the voltage down unit to the switches, to turn the switches off; and supplying a low-speed clock signal having a frequency lower than that of the reference clock signal to the voltage down unit and holding a turned-off state of the switches.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Hereinafter, a high frequency switching circuit and a method of controlling the same according to embodiments of the present invention will be described with reference to the accompanying drawings. A high frequency switching circuit and a method of controlling a high frequency switching circuit according to the embodiments of the present invention may be appropriately applied to a wireless communications system requiring a switching of communication modes, such as a universal mobile telecommunication system (UMTS), a global system for mobile communications (GSM), or the like. In particular, a high frequency switching circuit and a method of controlling a high frequency switching circuit according to the embodiments of the present invention may be effectively applied to communication systems such as UMTS in which a voltage down circuit needs to be operated at all times.

Embodiments

Figure 1:
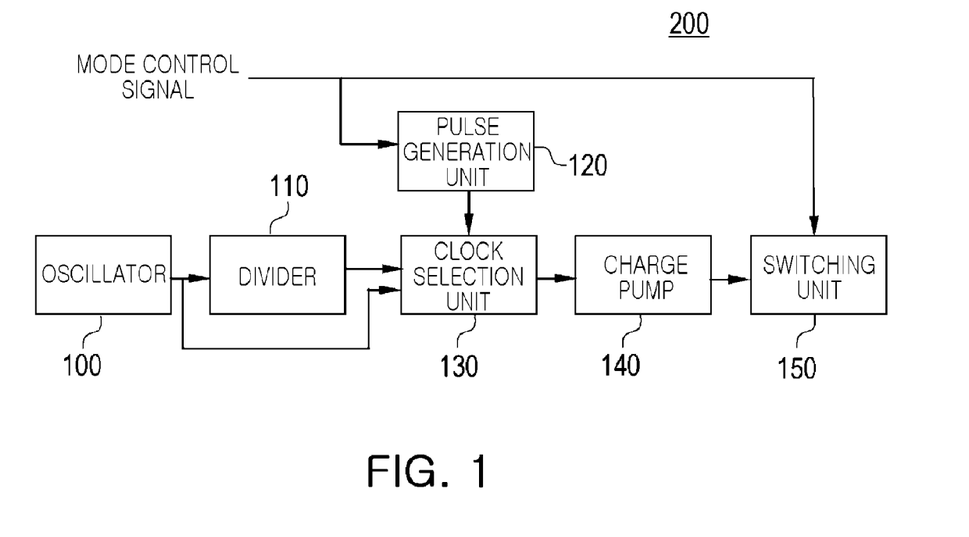
FIG. 1 is a block diagram schematically showing a high frequency switching circuit according to an embodiment of the present invention.

FIG. 1 is a block diagram schematically showing a high frequency switching circuit according to an embodiment of the present invention. The high frequency switching circuit according to the embodiment of the present invention may perform a charge pump by a high-speed reference clock signal when a communication mode is switched and perform a charge pump by a low-speed clock signal having a frequency lower than that of the reference clock signal after the communication mode is switched.

As shown in FIG. 1, a high frequency switching circuit 200 according to the embodiment of the present invention may be configured to include an oscillator 100, a divider 110, a pulse generation unit 120, a clock selection unit 130, a charge pump 140, and a switching unit 150.

The oscillator 100, an oscillation unit, may generate a reference clock signal having a predetermined frequency. An output terminal of the oscillator 100 may be connected with an input terminal of the divider 110 and an input terminal of the clock selection unit 130.

For example, the oscillator 100 may include a ring oscillator and generate a reference clock signal of several MHz. Here, a predetermined frequency may be about 3.6 MHz. However, a predetermined frequency is not limited thereto.

The divider 110, a division unit, may divide the reference clock signal to generate a low-speed clock signal. An input terminal of the divider 110 may be connected to the output terminal of the oscillator 100 and an output terminal of the divider 110 may be connected to the input terminal of the clock selection unit 130.

The divider 110 may include a counter and count the reference clock signal up to a predetermined counting number N to divide the reference clock signal by N, thereby generating a low-speed clock signal having a frequency lower than that of the reference clock signal. For example, when the reference clock signal is 3.6 MHz and N=64, a frequency of the low-speed clock signal may be 56 KHz.

Further, the divider 110 may simultaneously output clock signals having different frequencies.

The pulse generation unit 120, a pulse generation unit, may generate a clock selecting pulse signal having a predetermined active period. The pulse generation unit 120 may include an input terminal for receiving a mode control signal. An output terminal of the pulse generation unit 120 may be connected to the input terminal of the clock selection unit 130. Here, the mode control signal may be a control signal input from the outside so as to transfer a communication mode to the high frequency switching circuit 200.

The pulse generation unit 120 may include a counter, detect a change in the mode control signal to start a count, and measure an elapsed time. The pulse generation unit 120 may detect the change in the mode control signal, and then, activate the clock selecting pulse signal after a predetermined time has lapsed. Further, the pulse generation unit 120 may hold an active state of the clock selecting pulse signal for a predetermined active period. In the embodiment of the present invention, the active period may be set to be, for example, 5 to 10 µs. However, the active period is not limited thereto.

The clock selection unit 130, a clock selection unit, may select a clock signal. The clock selection unit 130 may include three input terminals. A first input terminal of the clock selection unit 130 may be connected to the output terminal of the oscillator 100, a second input terminal thereof may be connected to the output terminal of the divider 110, and a third input terminal thereof may be connected to the output terminal of the pulse generation unit 120. Alternatively, the output terminal of the clock selection unit 130 may be connected to the input terminal of the charge pump 140.

The clock selection unit 130 may include a selector and may select the reference clock signal when the clock selecting pulse signal is in an active state, but may select a low-speed clock signal when the clock selecting pulse signal is not in an active state. Alternatively, when the low-speed clock signal is provided in plural, the clock selection unit 130 may include a selector having n inputs and one output according to the number of low-speed clock signals.

The charge pump 140, a voltage down unit, may generate a predetermined negative voltage. The input terminal of the charge pump 140 may be connected to the output terminal of the clock selection unit 130 and the output terminal of the charge pump 140 may be connected to the input terminal of the switching unit 150.

The charge pump 140 may accumulate negative charges in a capacitor at a speed according to the frequency of the clock signal selected in the clock selection unit 130 and may generate a predetermined negative voltage. A configuration and operation of the charge pump 140 will be described below.

The switching unit 150, a switching unit, may ensure or block a communication path of the high frequency signal. One input terminal of the switching unit 150 may have a mode control signal input thereto, and the other input terminal may be connected to the output terminal of the charge pump 140. The switching unit 150, a switch, may include at least one field effect transistor (hereinafter, referred to as a 'FET'). A configuration and operation of the switching unit 150 will be described below.

In the high frequency switching circuit 200 according to the embodiment of the present invention configured as described above, the reference clock signal may be supplied to the charge pump 140 for the active period of the clock selecting pulse signal, and the low-speed clock signal may be supplied to the charge pump 140 for the inactive period of the clock selecting pulse signal. Further, an output voltage of the charge pump 140 may be supplied to the switching unit 150.

Figure 2A:
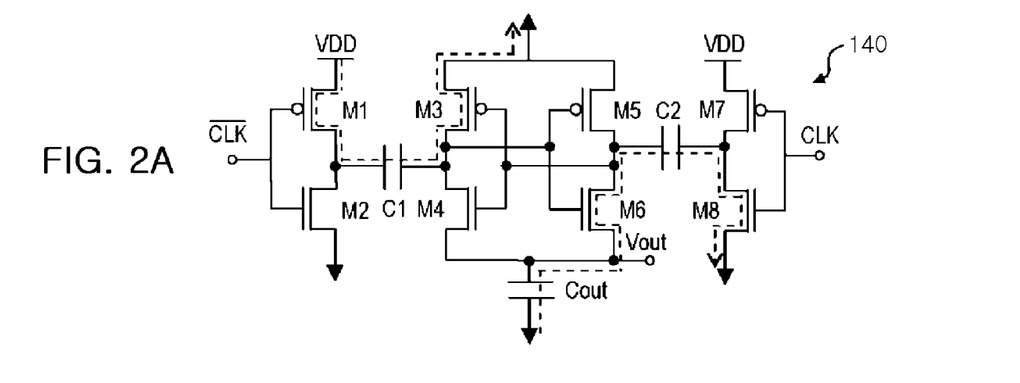
FIGS. 2A and 2B are circuit diagrams showing a configuration and an operation of a charge pump shown in FIG. 1.
Figure 2B:
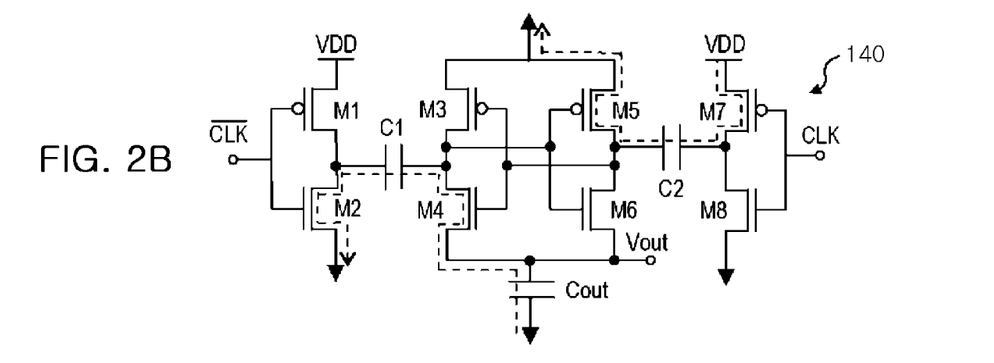

Next, an example of the charge pump 140 shown in FIG. 1 will be briefly described with reference to FIGS. 2A to 2C. FIGS. 2A and 2B are circuit diagrams for showing the configuration and operation of the charge pump 140 shown in FIG. 1.

As shown in FIGS. 2A and 2B, the charge pump 140 according to the embodiment of the present invention may include four complementary metal-oxide semiconductor (CMOS) inverters and three capacitors. The four CMOS inverters may each be configured to include a first inverter having transistors M1 and M2, a second inverter having transistors M3 and M4, a third inverter having transistors M5 and M6, and a fourth inverter having transistors M7 and M8.

An input terminal of the first inverter may be connected to the output terminal of the clock selection unit 130 through an inverter (not shown) and an output terminal of the first inverter may be connected to one terminal of a first capacitor C1. Alternatively, one of two power terminals of the first inverter may be connected to a power source voltage VDD and the other thereof may be grounded.

An input terminal of a second inverter may be connected to an output terminal of a third inverter, and an output terminal of the second inverter may be connected to the other terminal of the first capacitor C1. In addition, one of two power terminals of the second inverter may be grounded and the other thereof may be connected to one terminal of an output capacitor Cout. Further, the one terminal of the output capacitor Cout may be connected to the switching unit 150 and the other terminal of the output capacitor Cout may be grounded.

An input terminal of the third inverter may be connected to the output terminal of the second inverter, and an output terminal of the third inverter may be connected to one terminal of a second capacitor C2. One of two power terminals of the third inverter may be grounded and the other thereof may be connected to the one terminal of the output capacitor Cout.

An input terminal of the fourth inverter may be connected to the output terminal of the clock selection unit 130, and an output terminal of the fourth inverter may be connected to the other terminal of the second capacitor C2. One of two power terminals of the fourth inverter may be connected to a power source voltage VDD and the other thereof may be grounded.

The operation of the charge pump 140 according to the embodiment of the present invention configured as described above will be briefly described.

As shown in FIG. 2A, current may flow in the charge pump 140 through a first path and a second path shown by a dashed line within a period in which a clock signal CLK input to the charge pump 140 has a high level.

The first path may be a path from the VDD to a ground through the transistor M1, the first capacitor C1, and the transistor M3. In this configuration, the first capacitor C1 may be charged according to the flowing of current in the first path.

The second path may be a path from the second capacitor C2 to the second capacitor C2 through the transistor M8, the output capacitor Cout, and the transistor M6. In this configuration, negative charges of the second capacitor C2 may move to the output capacitor Cout according to the flowing of current in the second path, such that the output capacitor Cout is charged.

Meanwhile, as shown in FIG. 2B, current may flow through a third path and a fourth path shown by a dashed line within a period in which the clock signal has a low level.

The third path may be a path from the first capacitor C1 to the first capacitor C1 through the transistor M2, the output capacitor Cout, and the transistor M4. In this configuration, negative charges of the first capacitor C1 may move to the output capacitor Cout according to the flowing of current in the third path, such that the output capacitor Cout is charged.

The fourth path may be a path from the VDD to a ground through the transistor M7, the second capacitor C2, and the transistor M5. In this configuration, the second capacitor C2 may be charged according to the flowing of current in the fourth path.

As described above, as the clock signal is input and thus repeated current flows in the first path to the fourth path, negative voltage Vout may be generated in the output capacitor Cout. The negative voltage Vout may be supplied to the switching unit 150. In the first path to the fourth path, an average current of the repeated current contributes to consumption current, such that the faster the switching speed of a CMOS inverter is, that is, the higher the frequency of the clock signal is, the greater the current consumption is.

Figure 2C:
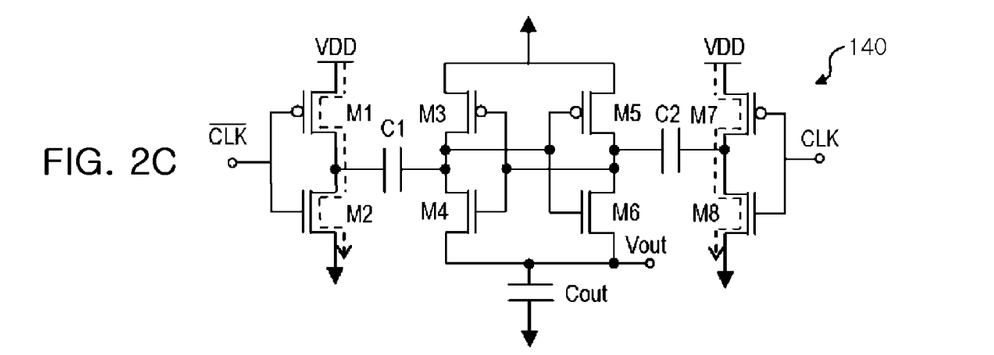
FIG. 2C is a circuit diagram for explaining a through current flowing in the charge pump.

Next, FIG. 2C is a circuit diagram for explaining a through current flowing in the charge pump 140. The through current in the CMOS inverter may indicate a state in which a large current flows by simultaneously turning-on a PMOS transistor and an NMOS transistor configuring the CMOS inverter. As shown in FIG. 2C, the through current shown by a dashed line in the first inverter and the fourth inverter may flow in the charge pump 140 according to the embodiment of the present invention. As the switching speed of the CMOS inverter is relatively fast, that is, the frequency of the clock signal has a relatively high level, the through current may be relatively large.

Therefore, it may need to lower the frequency of the clock signal so as to reduce the through current. However, the charge pump 140 needs to apply the predetermined negative voltage −2 to −2.5V to a gate terminal of the FET of the switching unit 150 within switching time (for example, 4 μs) of the communication mode required in a communications protocol. Hereinafter, the predetermined negative voltage may be referred to as a turn-off voltage. Therefore, the frequency of the clock signal needs to be sufficiently increased so that the output voltage of the charge pump 140 may reach the turn-off voltage within the switching time of the communication mode. In the embodiment of the present invention, the time it takes for the output voltage of the charge pump 140 to reach the turn-off voltage may be about 2 μs.

Therefore, in the high frequency switching circuit 200 according to the embodiment of the present invention, the charge pump 140 may be operated at the high-speed reference clock signal when the communication mode is switched, and may be operated at the low-speed clock signal after the communication mode is switched. Therefore, in the embodiment of the present invention, the output voltage Vout of the charge pump 140 may reach the turn-off voltage within the switching time of the communication mode while reducing the through current.

The configuration and operation of the charge pump 140 used in the embodiment of the present invention has been briefly described above. However, the charge pump 140 according to the embodiment of the present invention is not limited thereto.

Next, the switching unit 150 shown in FIG. 1 will be described in more detail with reference to FIGS. 3 and 4.

Figure 3:
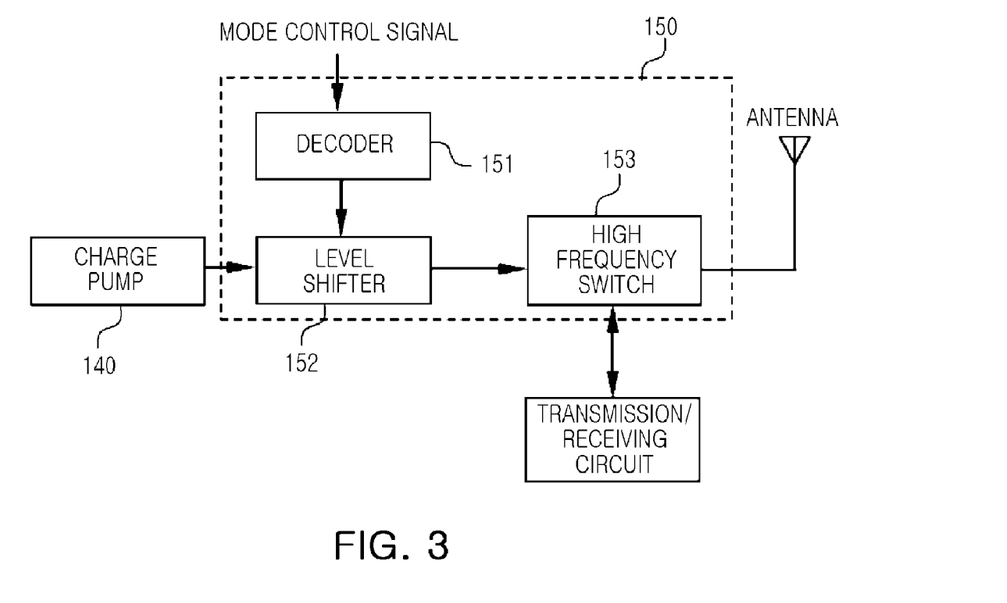
FIG. 3 is a block diagram for explaining a configuration of a switching unit shown in FIG. 1.

FIG. 3 is a schematic block diagram for explaining the configuration of the switching unit 150 shown in FIG. 1. As shown in FIG. 3, the switching unit 150 may be configured to include a decoder 151, a level shifter 152, and a high frequency switch 153.

The decoder 151 may decode a mode control signal. An input terminal of the decoder 151 may have a mode control signal input thereto. An output terminal of the decoder 151 may be connected to an input terminal of the level shifter 152.

The decoder 151 may decode a mode control signal, and may connect a turned-on FET and a turned-off FET among FETs included in the high frequency switch 153, to the level shifter 152, based on the decoding results. In the embodiment of the present invention, the decoder 151 may determine the turned-on FET and the turned-off FET according to a communication mode obtained by decoding the mode control signal.

The level shifter 152 may apply a predetermined positive voltage or the turn-off voltage to the high frequency switch 153. One input terminal of the level shifter 152 may be connected to an output terminal of the decoder 151, and the other input terminal thereof may be connected to the output terminal of the charge pump 140. The output terminal of the level shifter 152 may be connected to the input terminal of the high frequency switch 153. The level shifter 152 may apply a predetermined positive voltage to the turned-on FET among the FETs included in the high frequency switch 153 and apply the turn-off voltage to the turned-off FET among the FETs included in the high frequency switch 153, based on a communication mode obtained in the decoder 151. Hereinafter, the predetermined positive voltage is referred to as the turn-on voltage.

The high frequency switch 153 may ensure or block a communication path of a high frequency signal. The input terminal of the high frequency switch 153 may be connected to the output terminal of the level shifter 152. Further, the high frequency switch 153 may be connected with a transmission/receiving circuit and an antenna mounted externally to the high frequency switching circuit 200.

The high frequency switch 153 may include at least one FET as a switch. In the embodiment of the present invention, the high frequency switch 153 may be a high frequency switch of single-pole multi-throw (SPMT) or multi-pole multi-throw (MPMT) that is formed through, for example, a CMOS SOI process or a bulk CMOS process.

In the embodiment of the present invention, the turn-on voltage and the turn-off voltage applied to the gate terminal of the FET by the level shifter 152 may be 2.4 to 3.0V and −2 to −2.5V, respectively. The FET may be turned-on when a positive voltage is applied to the gate terminal and may be turned-off when 0 or a negative voltage is applied to the gate terminal. Further, when the turn-off voltage is applied to the gate terminal, the FET may hold a turned-off state thereof.

Applying the turn-off voltage so as to hold the FET in the turned-off state may be performed to prevent an output waveform from being distorted in the turned-off state of the FET even in a case in which relatively large transmission signal power of, for example, about 35 dBm is input to the FET. In other words, a margin in the turned-off state with respect to the voltage turning-on the FET may be relatively large by applying the turn-off voltage to the gate terminal.

Hereinafter, the configuration of the high frequency switch 153 will be described in more detail with reference to FIG. 4.

Figure 4:
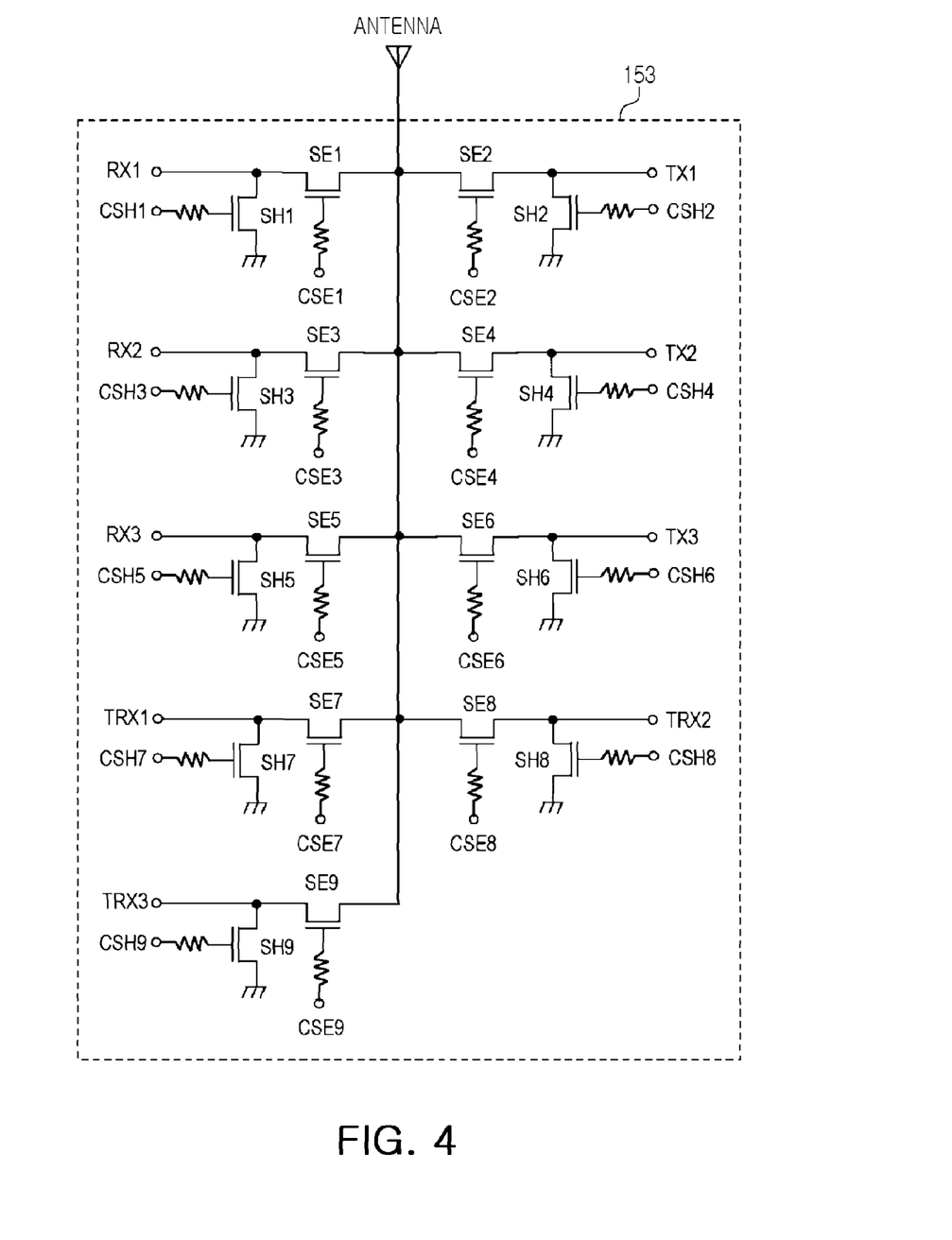
FIG. 4 is a circuit diagram for explaining a configuration of a high frequency switch shown in FIG. 3.

FIG. 4 is a circuit diagram showing the configuration of the high frequency switch 153 shown in FIG. 3. As shown in FIG. 4, the high frequency switch 153 according to the embodiment of the present invention may include nine radio frequency (RF) ports in total such as receiving ports RX1 to RX3, transmitting ports TX1 to TX3, and transmitting and receiving ports TXR1 to TXR3. Series FETs SE1 to SE9 may be installed in series between each RF port and the antenna in a path from the RF port to the antenna, and shunt FETs SH1 to SH9 may be installed therebetween in parallel.

Gate terminals of the series FETs SE1 to SE9 may be connected to control terminals CSE1 to CSE9 through a resistor, and gate terminals of the shunt FETs SH1 to SH9 may be connected to control terminals CSH1 to CSH9 through a resistor. The series FETs SE1 to SE9 and the shunt FETs SH1 to SH9 may be turned-on when a positive voltage is applied to the control terminal and may be turned-off when 0 or a negative voltage is applied thereto.

For example, when the communication mode is RX1, the control terminal CSE1 of the series FET SE1 may have the turn-on voltage applied thereto, and the control terminal CSH1 of the shunt FET SH1 may have the turn-off voltage applied thereto. Further, the series FETs SE2 to SE9 may have the turn-off voltage applied thereto and the shunt FETs SH2 to SH9 may have the turn-on voltage applied thereto. As described above, the receiving ports RX1 may be definitely connected to the antenna, and the other RF ports may be blocked from the antenna, by applying the turn-on voltage or the turn-off voltage to the control terminals CSE1 to CSE9 and CSH1 to CSH9 of the FET.

In addition, when the communication mode is not RX1, the RF port may be connected to the antenna in a similar way. For example, when the communication mode is RX2, the turn-on voltage is applied to the series FET SE3, and the shunt FETs SH1, SH2, and SH3 to SH9. However, the series FETs SE1, SE2, and SE4 to SE9 may have the turn-off voltage applied thereto, and the shunt FET SH3 may have the turn-on voltage applied thereto. That is, the turn-on voltage may be applied to the control terminal of the series FETs that are installed in series in the path from a targeted RF port to the antenna, and the turn-off voltage may be applied to the control terminal of the series FET other than the targeted RF port. The turn-off voltage may be applied to the control terminal of the shunt FETs that are installed in parallel in the path from a targeted RF port to the antenna, and the turn-on voltage may be applied to the control terminal of the shunt FET other than the targeted RF port.

As described above, the configuration and operation of the switching unit 150 used in the embodiment of the present invention were briefly described. However, the switching unit 150 according to the embodiment of the present invention is not limited thereto. For example, the number of RF ports included in the high frequency switch 153 may be appropriately changed according to a communication mode.

Next, a method of controlling a high frequency switching circuit according to an embodiment of the present invention will be described with reference to FIGS. 5 and 6.

Figure 5:
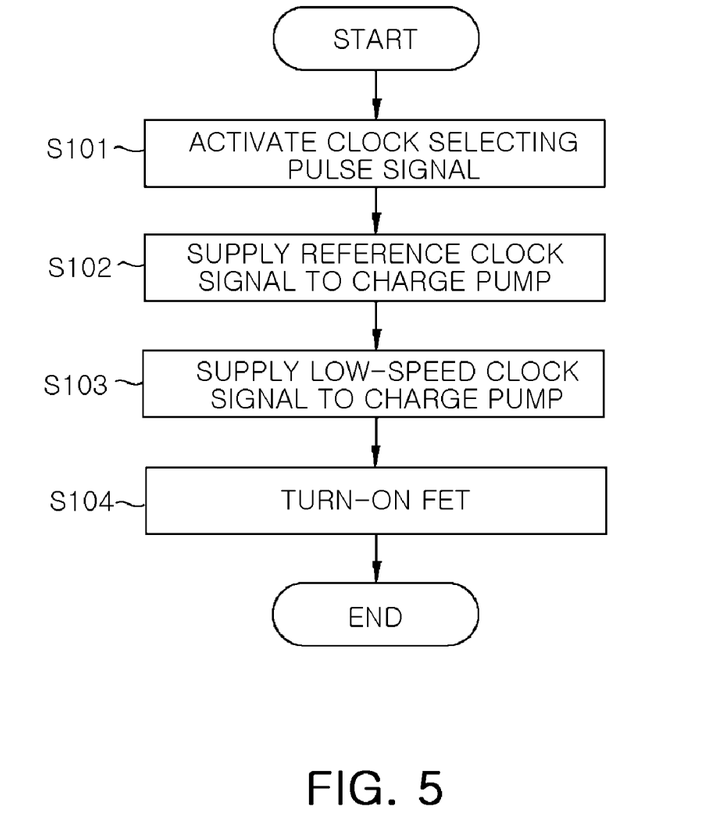
FIG. 5 is a flow chart for explaining a method of controlling a high frequency switching circuit according to another embodiment of the present invention.
Figure 6:
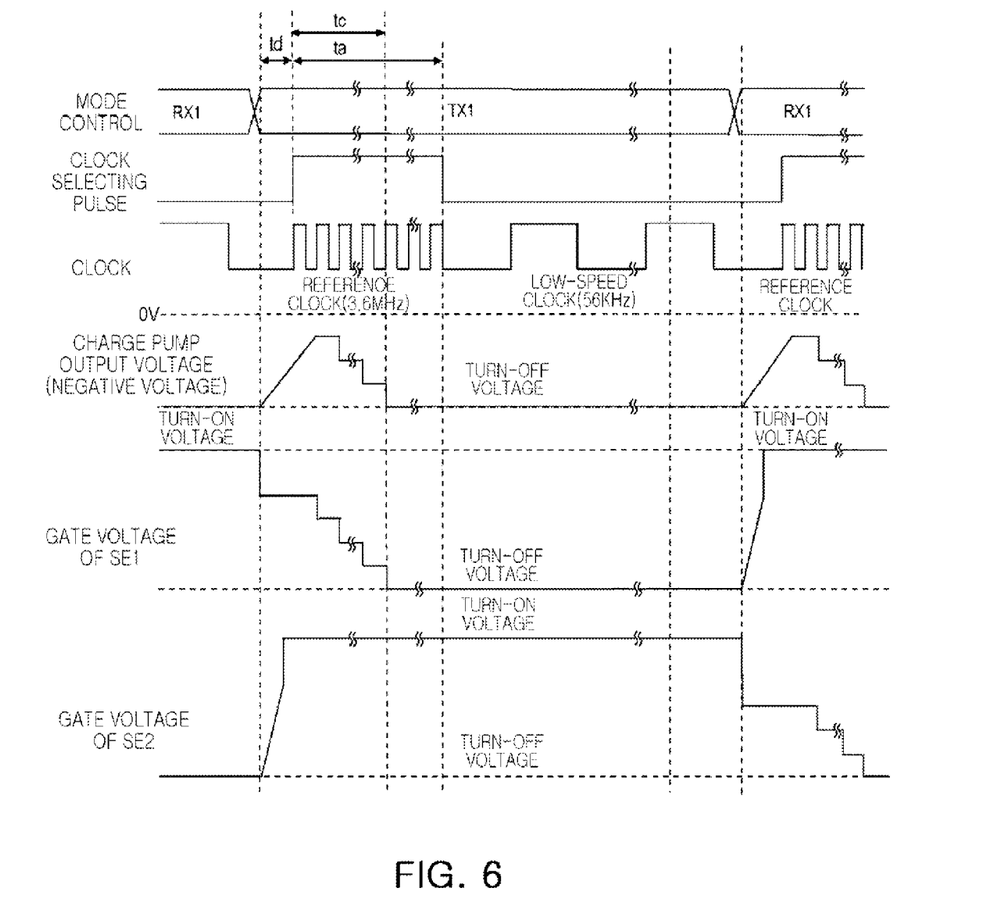
FIG. 6 is an interval chart for explaining an operation of the high frequency switching circuit according to the embodiment of the present invention.

FIG. 5 is a flow chart for explaining a method of controlling a high frequency switching circuit according to another embodiment of the present invention and FIG. 6 is an interval chart for explaining an operation of the high frequency switching circuit according to the embodiment of the present invention. For reference, FIG. 6 shows an example of an operation of the case in which a time division duplex (TDD) system is connected to the high frequency switching circuit according to the embodiment of the present invention.

As shown in FIG. 6, in the TDD system, the communication mode may be switched to, for example, RX1, TX1, RX1, . . . . On the other hand, the receiving side series FET (SE1 of FIG. 4) of the switching unit 150 may be controlled to be turned-on, turned-off, turned-on, . . . , and the transmitting side series FET (SE2 of FIG. 4) may be controlled to be turned-off, turned-on, turned-off, . . . . Hereinafter, the method of controlling a high frequency switching circuit according to the embodiment of the present invention will be described in connection with a period in which the communication mode is switched from the RX1 to the TX1 and then again switched from the TX1 to RX1.

As shown in FIG. 5, in the method of controlling a high frequency switching circuit according to the embodiment of the present invention, a clock selecting pulse signal may be first activated (S101). More specifically, as shown in FIG. 6, the pulse generation unit 120 may activate (to a high state) the clock selecting pulse signal after a mode control signal is changed from the RX1 to TX1 and then after a delay time td. For reference, in the embodiment of the present invention, the clock selecting pulse signal may be a high/active signal. However, the clock selecting pulse signal may also be a low/active signal.

Thereafter, the reference clock signal may be supplied to the charge pump (S102). More specifically, as shown in FIG. 6, a reference clock signal may be selected in an active period (period ta) of the clock selecting pulse signal. Therefore, the reference clock signal of 3.6 MHz may be supplied to the charge pump 140. Meanwhile, the charge pump 140 may accumulate negative charges in the output capacitor Cout at the speed according to a reference clock signal frequency to thus generate the negative voltage. Further, the negative charges accumulated in the output capacitor Cout may be transferred to the gate terminal of the SE1 of the switching unit 150, and thus, the negative voltage may be applied to the SE1, thereby turning the SE1 off. The transfer of the negative charges from the charge pump 140 may end when a potential of the output capacitor Cout of the charge pump 140 and a potential of the gate terminal of the SE1 are co-potential (turn-off voltage). A time tc, a time until a reference clock signal of the charge pump 140 reaches the turn-off voltage after the reference clock signal starts to be supplied to the charge pump 140, may be required. In the embodiment of the present invention, tc may be about 2 μs.

Meanwhile, at the transmitting side, the decoder 151 of the switching unit 150 may decode the mode control signal, and the SE2 may have the turn-on voltage applied thereto by the level shifter 152.

Thereafter, the low-speed clock signal may be supplied to the charge pump (S103). More specifically, in the pulse generation unit 120, the clock selecting pulse signal may have a high level state and then, the clock selecting pulse signal may have a low level state after ta. Here, in order for the charge pump 140 to certainly generate the turn-off voltage, ta needs to be set to a length above tc. Meanwhile, in connection with the reduction in the through current, ta may be set to be a value approximating to tc. In the embodiment of the present invention, ta may be about 5 to 10 μs. The low-speed clock signal may be selected in a period in which the clock selecting pulse signal is in a low state. Therefore, the low-speed clock signal of 56 KHz having a frequency lower than that of the reference clock signal may be supplied to the charge pump 140. Meanwhile, the charge pump 140 may accumulate the negative charges in the output capacitor Cout at the speed based on the frequency of the low-speed clock signal to thus hold the turn-off voltage. Therefore, the potential of the output capacitor Cout of the charge pump 140 and the potential of the gate terminal of SE1 of the switching unit 150 may be held at co-potential and the SE1 of the switching unit 150 may hold the turned-off state.

Thereafter, the FET may be turned-on (S104). More specifically, the level shifter 152 may apply the turn-on voltage to the SE1 according to the communication mode RX1 obtained by decoding the mode control signal by the decoder 151 of the switching unit 150. In this case, the negative charges accumulated in the gate terminal of the SE1 may be discharged, and thus, the potential of the output capacitor Cout of the charge pump 140 may rise.

According to the embodiment of the present invention, the method of controlling a high frequency switching circuit is described above. In the method of controlling a high frequency switching circuit according to the embodiment of the present invention, the clock selecting pulse signal may be first activated and the reference clock signal may be supplied to the charge pump 140 to thus turn-off the SE1 of the switching unit 150. Then, the SE1 holds the turned-off state by supplying the low-speed clock signal to the charge pump 140. Further, when the turn-on voltage is applied to the SE1, the SE1 may be turned-on.

Inventive Example

Hereinafter, an Inventive Example of the case in which the high frequency switching circuit 200 according to the embodiment of the present invention is applied to a communication system is provided. However, the present invention is not limited thereto.

In the experiment, the average power consumption of the high frequency switching circuit 200 according to the embodiment of the present invention was measured under the following conditions.

The oscillator 100 generated the reference clock signal of 3.6 MHz and the divider 110 divided the reference clock signal into 64 to generate the low-speed clock signal of 56 KHz.

The communication mode was switched by inputting the mode control signal and the clock selecting pulse signal was generated. The reference clock signal was supplied to the charge pump 140 over 5 μs, and then, the low-speed clock signal was supplied.

The communication mode was switched and the above-mentioned process was repeated over several cycles. In this case, the average current consumed in the high frequency switching circuit 200 was measured. As the result, the average current consumption in the high frequency switching circuit 200 was 45 μA.

Meanwhile, as Comparative Example, in the case in which the reference clock signal of 3.6 MHz is supplied to the charge pump at all times, the average current consumption was also similarly measured. As the result, the average current consumption was 115 μA. That is, comparing with Comparative Example, the embodiment of the present invention provided the reduction of about 60% in the current consumption.

As described above, the above-mentioned embodiment of the present invention may provide the following effects.

(A) According to the high frequency switching circuit and the method of controlling a high frequency switching circuit according to the embodiment of the present invention, power consumption may be reduced at the time of signal reception and at the time of signal transmission. Therefore, even in a case in which there is a need to operate the charge pump at all times in the communication system such as the UMTS, power consumption may be reduced.

(B) Since the predetermined active period is longer than the time until the charge pump generates the turn-off voltage after the clock selecting pulse signal is activated, the charge pump may certainly generate the turn-off voltage.

(C) The switching unit includes the plurality of switches and controls the turn-on/off of the plurality of switches based on the results obtained by decoding the mode control signal input from the outside. Therefore, arbitrary switching between the plurality of RF ports and the antenna may be performed.

(D) The switching unit has the level shifter applying the predetermined negative voltage or the predetermined positive voltage to the switch based on the results obtained by decoding the mode control signal. Therefore, the predetermined negative voltage or the predetermined positive voltage may be applied to the switch device according to the change in the mode control signal.

(E) The pulse generation unit may generate the clock selecting pulse signal after the mode control signal is changed. Therefore, the clock selecting pulse signal may be generated at an appropriate interval after the mode control signal is changed.

(F) The high frequency switching circuit includes the oscillator generating the reference clock signal and the divider dividing the reference clock signal to generate the low-speed clock signal. Therefore, since the oscillator for the low-speed clock signal is not separately provided, the number of oscillators within the high frequency switching circuit may be reduced.

As described above, according to the embodiment of the present invention, the high frequency switching circuit and the method of controlling a high frequency switching circuit according to the embodiment of the present invention was described. However, appropriate addition, modification and omission may be applied to the invention by those skilled in the art within the scope of the present invention.

For example, in the embodiments of the present invention, the low-speed clock signal is generated by dividing the reference clock signal. However, the low-speed clock signal may be generated in other oscillators different from the oscillator generating the reference clock signal.

In addition, the embodiment of the present invention mainly describes the case in which the clock signal is switched once from the reference clock signal to the low-speed clock signal having a frequency lower than that of the reference clock signal. However, the clock signal may be switched stepwise to the plurality of low-speed clock signals having different frequencies from the reference clocks signal.

As set forth above, in a high frequency switching circuit and a method of controlling a high frequency switching circuit according to embodiments of the present invention, power consumption may be reduced at the time of a signal transmission as well as a signal reception. Therefore, even in a case in which there is a need to operate a voltage down circuit at all times in a communication system such as a UMTS, power consumption may be reduced.

While the present invention has been shown and described in connection with the above-described embodiments, it will be apparent to those in the art that modifications and variations can be made without departing from the spirit and scope of the invention as defined by the appended claims.

What is claimed is:

1. A high frequency switching circuit, comprising:
   a pulse generation unit generating a clock selecting pulse signal having a predetermined active period;
   a clock selection unit selecting a reference clock signal when the clock selecting pulse signal is in an active state and selecting a low-speed clock signal having a frequency lower than that of the reference clock signal when the clock selecting pulse signal is not in an active state;
   a voltage down unit accumulating negative charges in a capacitor at a speed according to the frequency of the clock signal selected in the clock selection unit to generate predetermined negative voltage; and
   a switching unit including a plurality of switches and controlling turning on and turning off operations of the plurality of switches, based on a result of decoding a mode control signal input from the outside,
   wherein the switching unit includes a level shifter applying a predetermined negative voltage or a predetermined positive voltage to the switches, based on a result of decoding the mode control signal.

2. The high frequency switching circuit of claim 1, wherein the predetermined active period is longer than a time for the voltage down unit to generate the predetermined negative voltage after the clock selecting pulse signal is activated.

3. The high frequency switching circuit of claim 1, wherein the plurality of switches include at least one switch holding a turned-off state by being applied with the predetermined negative voltage.

4. The high frequency switching circuit of claim 1, wherein the pulse generation unit generates the clock selecting pulse signal after the mode control signal is changed.

5. The high frequency switching circuit of claim 1, further comprising:
   an oscillator generating the reference clock signal; and
   a divider dividing the reference clock signal to generate the low-speed clock signal.

6. A method of controlling a high frequency switching circuit, comprising:
   activating a clock selecting pulse signal after a mode control signal is changed;
   supplying a reference clock signal to a voltage down unit for an active period of the clock selecting pulse signal and applying predetermined negative voltage generated by the voltage down unit to the switches, based on a result of decoding the mode control signal, to turn the switches off; and
   supplying a low-speed clock signal having a frequency lower than that of the reference clock signal to the voltage down unit and holding a turned-off state of the switches.

7. The method of claim 6, wherein the active period of the clock selecting pulse signal is longer than a time for the voltage down unit to generate the predetermined negative voltage after the clock selecting pulse signal is activated.

* * * * *